United States Patent
Hussain et al.

(10) Patent No.: US 9,224,813 B2
(45) Date of Patent: Dec. 29, 2015

(54) CYLINDRICAL-SHAPED NANOTUBE FIELD EFFECT TRANSISTOR

(75) Inventors: Muhammad M. Hussain, Thuwal (SA); Hossain M. Fahad, Thuwal (SA); Casey E. Smith, Thuwal (SA); Jhonathan P. Rojas, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 14/002,344

(22) PCT Filed: Mar. 2, 2012

(86) PCT No.: PCT/US2012/027436
§ 371 (c)(1),
(2), (4) Date: Sep. 23, 2013

(87) PCT Pub. No.: WO2012/119053
PCT Pub. Date: Sep. 7, 2012

(65) Prior Publication Data
US 2014/0008606 A1    Jan. 9, 2014

Related U.S. Application Data

(60) Provisional application No. 61/448,575, filed on Mar. 2, 2011.

(51) Int. Cl.
*H01L 29/06*    (2006.01)
*H01L 29/66*    (2006.01)
(Continued)

(52) U.S. Cl.
CPC ............. *H01L 29/0676* (2013.01); *B82Y 10/00* (2013.01); *H01L 29/41758* (2013.01);
(Continued)

(58) Field of Classification Search
None
See application file for complete search history.

(56) References Cited

U.S. PATENT DOCUMENTS 5,382,816 A    1/1995   Mitsui
5,561,308 A    10/1996  Kamata et al.
(Continued)

FOREIGN PATENT DOCUMENTS

EP    1507294 A2    2/2005
JP    6334146 A     12/1994
(Continued)

OTHER PUBLICATIONS

International Preliminary Report on Patentability dated Sep. 3, 2013, issued during examination of International Application No. PCT/US2012/027436.
(Continued)

*Primary Examiner* — Andres Munoz
(74) *Attorney, Agent, or Firm* — Norton Rose Fulbright US LLP

(57) ABSTRACT

A cylindrical-shaped nanotube FET may be manufactured on silicon (Si) substrates as a ring etched into a gate stack and filled with semiconductor material. An inner gate electrode couples to a region of the gate stack inside the inner circumference of the ring. An outer gate electrode couples to a region of the gate stack outside the outer circumference of the ring. The multi-gate cylindrical-shaped nanotube FET operates in volume inversion for ring widths below 15 nanometers. The cylindrical-shaped nanotube FET demonstrates better short channel effect (SCE) mitigation and higher performance ($I_{on}/I_{off}$) than conventional transistor devices. The cylindrical-shaped nanotube FET may also be manufactured with higher yields and cheaper costs than conventional transistors.

17 Claims, 9 Drawing Sheets

(51) Int. Cl.
  *H01L 29/417* (2006.01)
  *H01L 29/786* (2006.01)
  *H01L 29/775* (2006.01)
  *B82Y 10/00* (2011.01)
  *H01L 29/78* (2006.01)

(52) U.S. Cl.
  CPC .... *H01L29/66439* (2013.01); *H01L 29/66484* (2013.01); *H01L 29/66666* (2013.01); *H01L 29/66977* (2013.01); *H01L 29/775* (2013.01); *H01L 29/7831* (2013.01); *H01L 29/78642* (2013.01); *H01L 29/78648* (2013.01); *H01L 29/7827* (2013.01)

(56) References Cited

U.S. PATENT DOCUMENTS

| | | | |
|---|---|---|---|
| 5,656,842 | A | 8/1997 | Iwamatsu et al. |
| 5,707,885 | A | 1/1998 | Lim |
| 5,994,735 | A | 11/1999 | Maeda et al. |
| 8,871,576 | B2 * | 10/2014 | Tekleab et al. ............... 438/157 |
| 2006/0261406 | A1 | 11/2006 | Chen |
| 2009/0032849 | A1 | 2/2009 | Higashino |

FOREIGN PATENT DOCUMENTS

| | | |
|---|---|---|
| JP | 8051203 A | 2/1996 |
| JP | 3225873 B2 | 11/2001 |

OTHER PUBLICATIONS

Hossain M. Fahad et al., "Silicon Nanotube Field Effect Transistor with Core-Shell Gate Stacks for Enhanced High-Performance Operatoin of Area Scaling Benefits", Nano Letters, Oct. 12, 2011, vol. 11, No. 10, pp. 4393-4399.

International Search Report dated Jul. 11, 2012, issued during prosecution of International Application No. PCT/US/2012/027436.

* cited by examiner

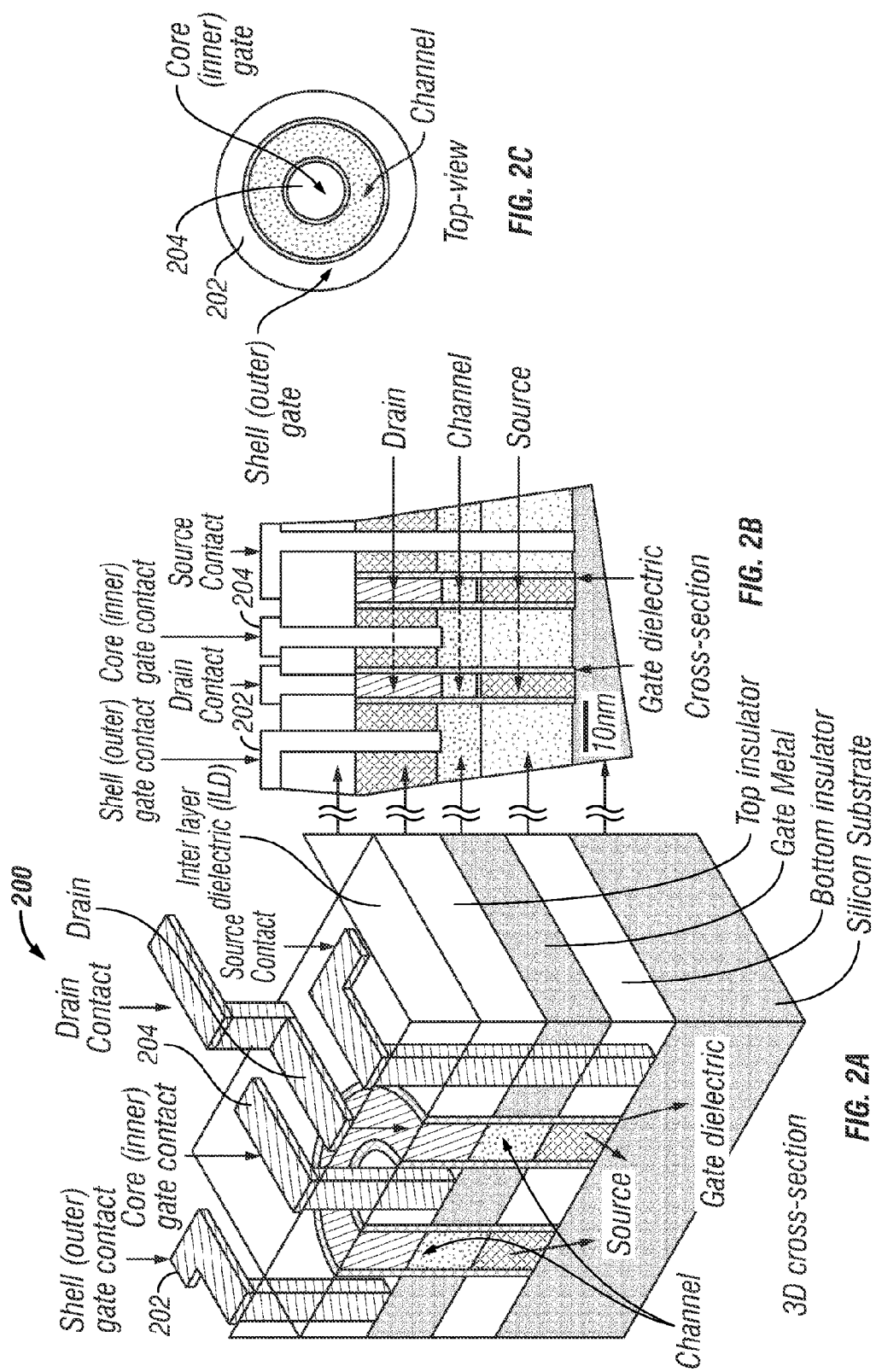

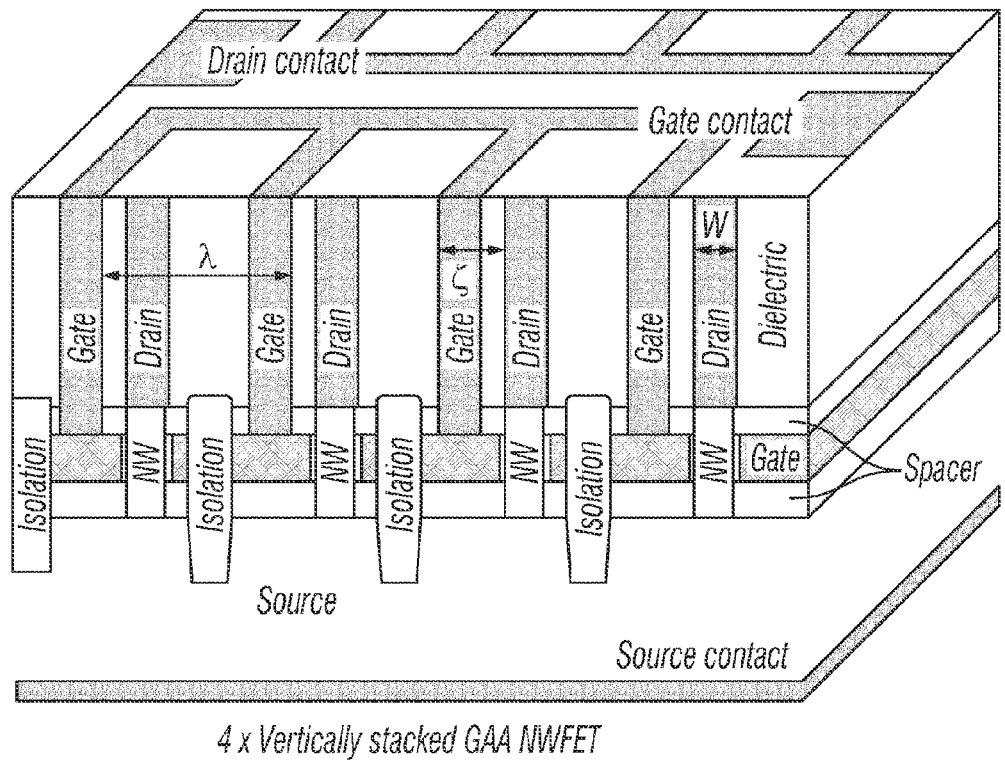
4 x Vertically stacked GAA NWFET
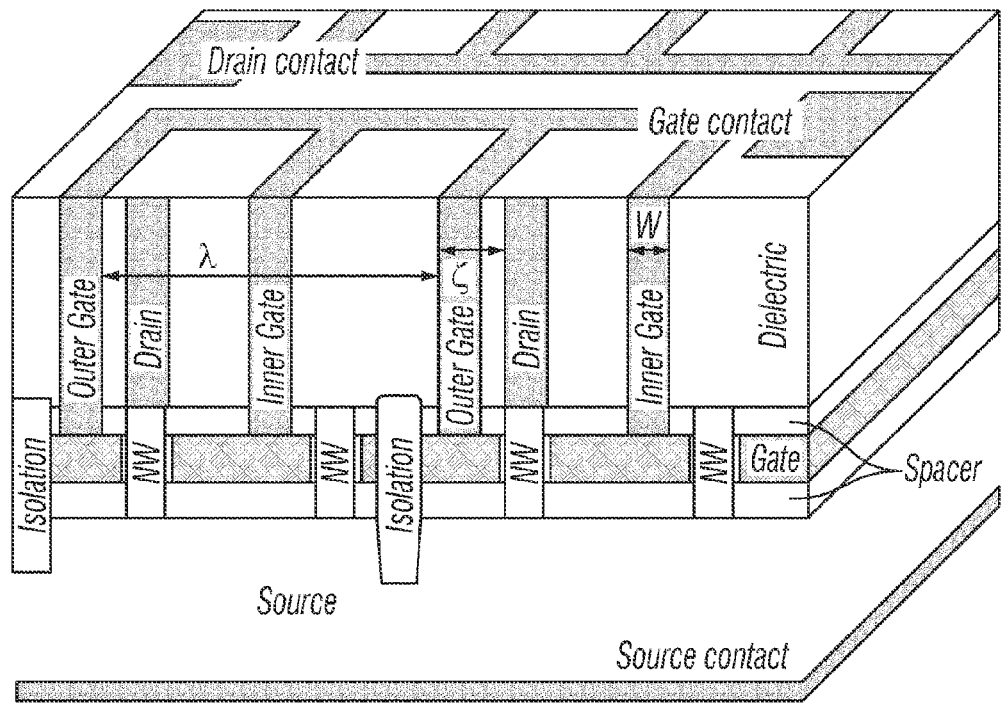
2 x Vertically stacked NTFET
*FIG. 5*

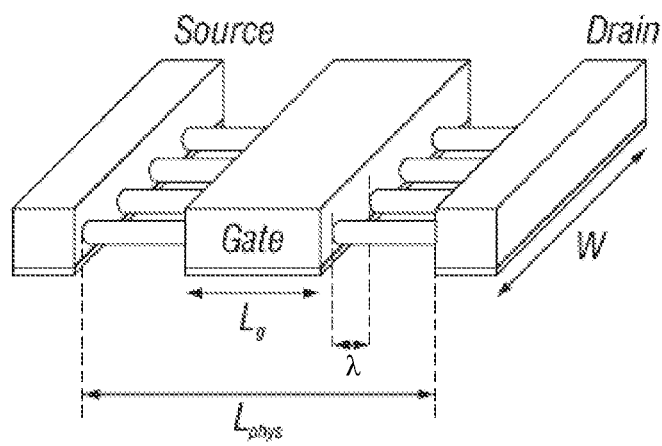
*4 x Laterally stacked GAA NWFET*
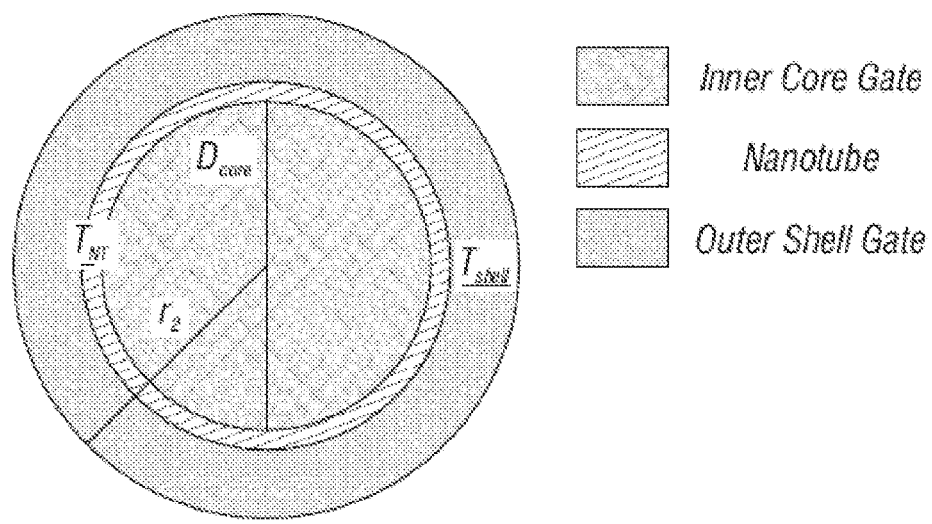
*Top View of a single NTFET*
FIG. 5 (Cont'd)

CYLINDRICAL-SHAPED NANOTUBE FIELD EFFECT TRANSISTOR

CROSS-REFERENCE TO RELATED APPLICATIONS

This application is a national phase application under 35 U.S.C. §371 that claims priority to PCT Application No. PCT/US2012/027436 to King Abdullah University of Science and Technology filed Mar. 2, 2012, which claims the benefit of priority to U.S. Provisional Patent Application Ser. No. 61/448,575 filed on Mar. 2, 2011, both of which are specifically incorporated herein by reference without disclaimer.

BACKGROUND OF THE INVENTION

1. Field of the Invention

This invention relates to semiconductor nanoelectronics devices and more particularly relates to a cylindrical-shaped nanotube field effect transistor.

2. Description of the Related Art

Increasing the computational capability of electronic devices often depends on increasing the number of transistors in an integrated circuit. Moore's Law suggests that the number of transistors in an integrated circuit doubles approximately every two years. Continuing to advance electronic devices at the rate suggested by Moore's Law has resulting in scaling the transistor dimensions such that a transistor occupies smaller areas, which allows higher densities of transistors in an integrated circuit.

Physical scaling of the transistor can result in changes in device physics. For example, as the gate length of a transistor decreases below 50 nanometers short channel effects (SCE) become more pronounced as well as device variability, gate control, and leakage power dissipation control becomes challenging. Additionally, understanding of quasi-ballistic to ballistic transportation is more difficult as the devices scale in size. Conventionally, transistors have been built on silicon-on-insulator (SOI)-based or ultra-thin body (UTB)-based multi-gate devices to present better electrostatic control and reduced parasitic short channel effects.

Volume inversion effects have been employed to improve performance in multi-gate devices. Volume inversion effects are introduced when the thickness of the semiconductor film is reduced below the inversion layer thickness induced by the multiple gates. For example, in a double gate SOI FET volume inversion is achieved when the silicon (Si) film is thinner than the inversion layer thickness induced by the two gates. In volume inversion, an inversion layer is formed at the interfaces of the silicon film and throughout the silicon film. When a device operates in volume inversion carriers are distributed throughout the silicon film. The volume inversion presents a significant number of advantages, such as enhancement of the number of minority carriers, an increase in drain current and transconductance, decrease of low frequency noise, and a reduction in hot-carrier effects.

However, SOI-based and UTB-based multi-gate transistors are difficult to manufacture because of the high aspect ratio feature etching, cost of SOI or UTB devices, dopant diffusion and uniform profile control with angled implantation for high aspect ratio devices, contact engineering, and position control.

SUMMARY OF THE INVENTION

According to one embodiment, an apparatus includes a substrate. The apparatus also includes a first gate stack on the substrate. The apparatus further includes a second gate stack on the substrate, the second gate stack having a ring shape and being disposed around the first gate stack. The apparatus also includes a ring of semiconductor material disposed between the first gate and the second gate comprising a source region, a drain region, and a channel region.

According to another embodiment, a method includes depositing a gate stack on a substrate. The method also includes etching a ring in the gate stack. The method further includes depositing a semiconductor material in the etched ring.

The term "coupled" is defined as connected, although not necessarily directly, and not necessarily electrically or mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

FIG. 2A is a 3D cross section cut through the middle (from top view) of a cylindrical-shaped nanotube FET according to one embodiment of the disclosure.

FIG. 2B is a transmission electron microscopy (TEM) image of a cross-sectional view of a cylindrical-shaped nanotube FET according to one embodiment of the disclosure.

FIG. 2C is a top view of a cylindrical-shaped nanotube FET cut through the channel area, according to one embodiment of the disclosure.

FIG. 5 shows the area efficiency benefits of cylindrical-shaped nanotube FET, according to one embodiment of the disclosure.

FIGS. 3A, 3C show the cross section, and FIGS. 3B, 3D show the top view layout with contacts for Si gate-all-around nanowire FET and Si nanotube FET, respectively, where the minimum gate-to-gate pitch, $\lambda$=70–80 nm, minimum contact gate pitch, $\zeta$=5 nm and minimum contact width, W=20 nm.

DETAILED DESCRIPTION

Various features and advantageous details are explained more fully with reference to the non-limiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

Figure 1A:
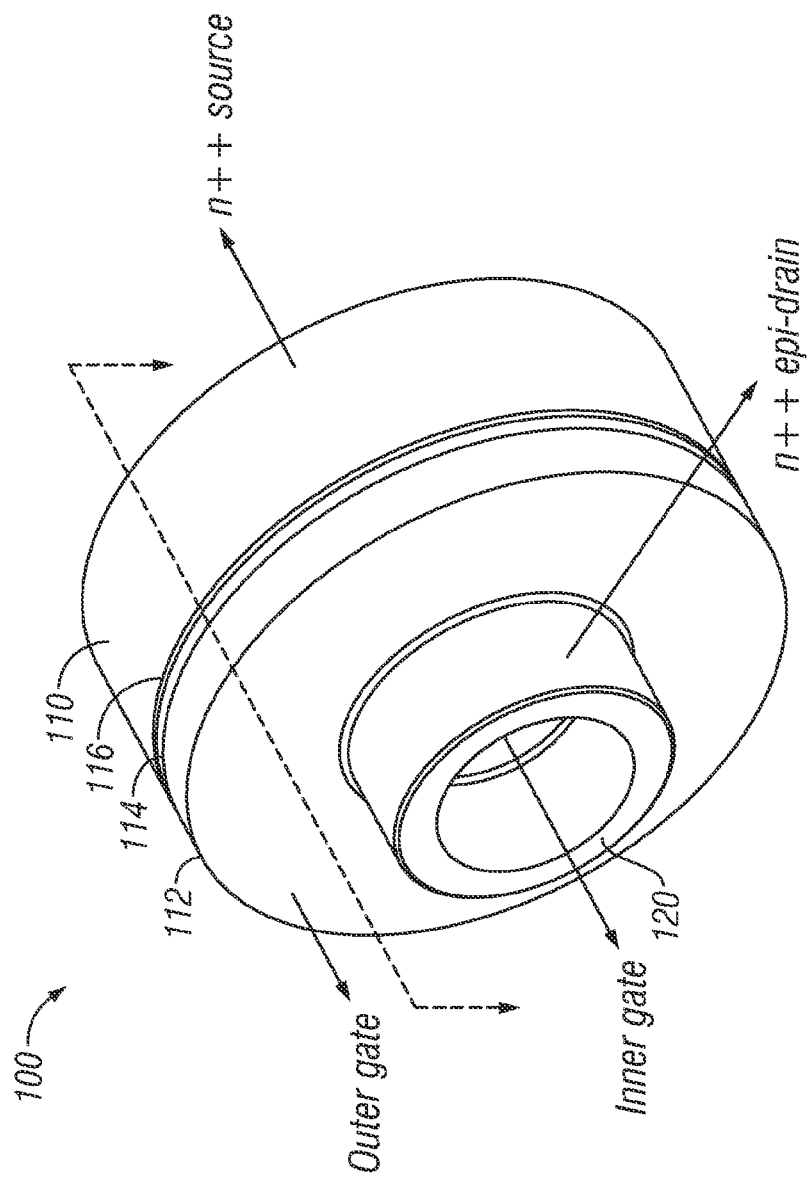
FIG. 1A is an illustration of a cylindrical-shaped nanotube field effect transistor (FET) architecture according to one embodiment of the disclosure.
Figure 1B:
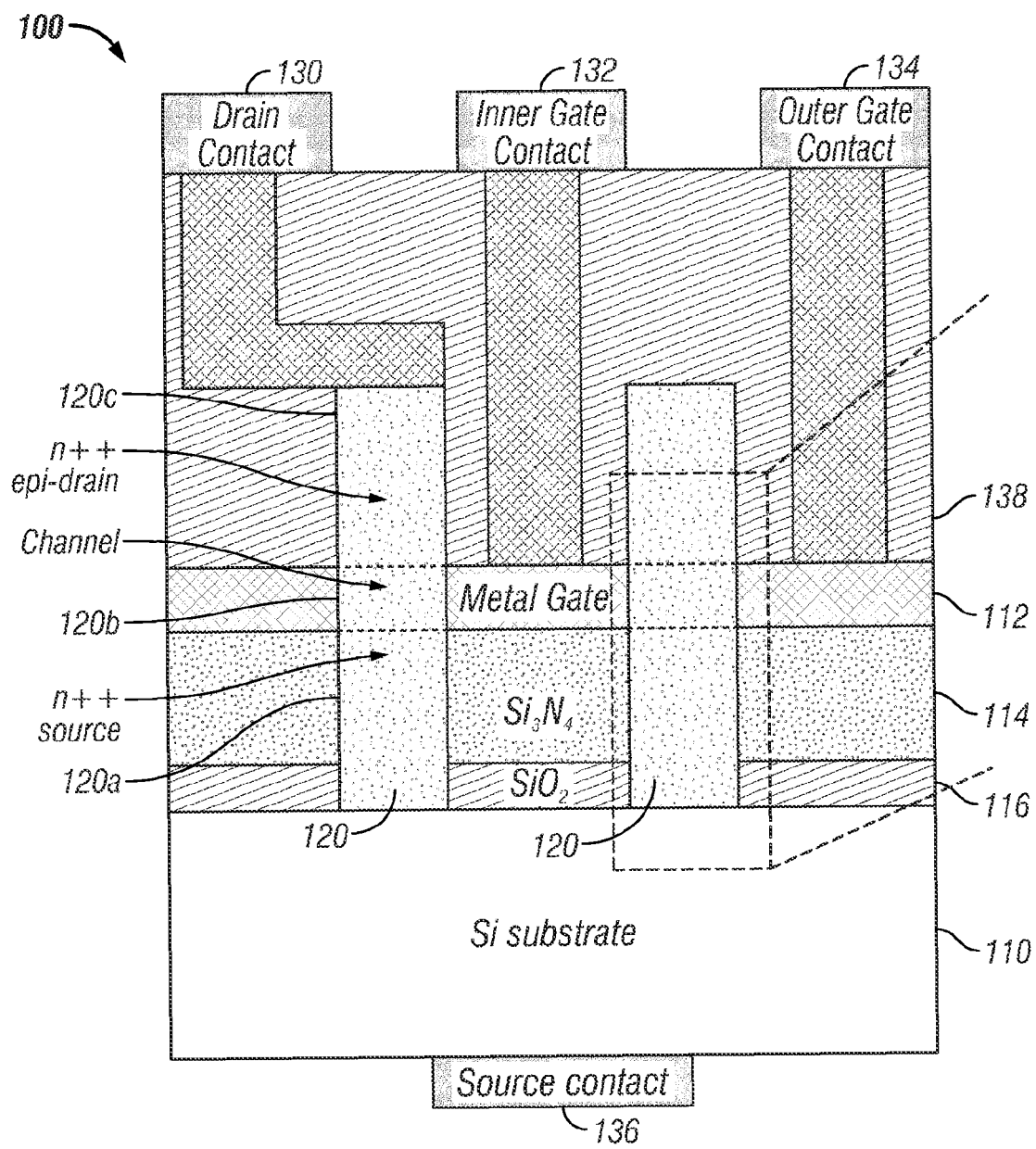
FIG. 1B is a cross-section of the cylindrical-shaped nanotube FET with contacts according to one embodiment of the disclosure.

FIG. 1A is an illustration of a cylindrical-shaped nanotube field effect transistor architecture according to one embodiment of the disclosure. A cross-section of the cylindrical-shaped nanotube FET is illustrated in FIG. 1B. A gate stack of a transistor 100 is located above a substrate 110 and may include an insulator 116, an insulator 114, and a conductive gate 112. According to one embodiment, the substrate 110 may be silicon, the insulator 116 may be silicon dioxide, the insulator 114 may be silicon nitride, and the conductive gate 112 may be titanium nitride. In one embodiment, the insulators 114, 116 may comprise dielectric materials, such as high-k dielectric, e.g., $HfO_2$, $LaO_x$, $Al_2O_3$, or the like. In one embodiment, the conductive gate 112 may comprise metals, TiN, TaN, $WN_x$, poly silicon, or the like. A insulator 138 is located above the gate stack, which may be, for example, a silicon dioxide formed from tetraethylorthosilicate (TEOS). A cylindrical ring 120 is formed in the gate stack. The ring 120 may be deposited on the substrate 110 through an epitaxial process after etching the ring 120. For example, when the substrate 110 is silicon the ring 120 may be epitaxial silicon. In another embodiment, the ring 120 may comprise any materials in groups II to IV of the periodic table. In yet another embodiment, the ring 120 may comprise any materials in groups III to V of the periodic table. Alternatively, the ring 120 may comprise composites such as silicon-germanium, InGaAs, or the like.

The ring may include a source region 120a extending through the insulator 114, a channel region 120b extending through the conductive gate 112, and a drain region 120c extending through the insulator 138. The source region 120a may be n-doped with arsenic (As) and have an approximate dopant concentration of $5\times10^{19}$ to $5\times10^{20}$ cm$^{-3}$. The drain region 120c may be n-doped with arsenic (As) and have an approximate dopant concentration of $5\times10^{19}$ to $5\times10^{20}$ cm$^{-3}$. In another embodiment, the dopant source region 120a and/or drain region 102c may be doped with dopant such as phosphorus, antimony and/or boron with appropriate doping level In another embodiment, the source region 120a and/or the drain region 120c may be p-type.

Contacts may be located on the transistor 100 to access the transistor 100. According to one embodiment, the transistor 100 may include a drain contact 130, an inner gate contact 132, an outer gate contact 134, and a source contact 136. The inner gate contact 132 couples to a first gate stack inside the inner circumference of the ring 120. The outer gate contact 134 couples to a second gate stack outside the outer circumference of the ring 120.

Figure 1C:
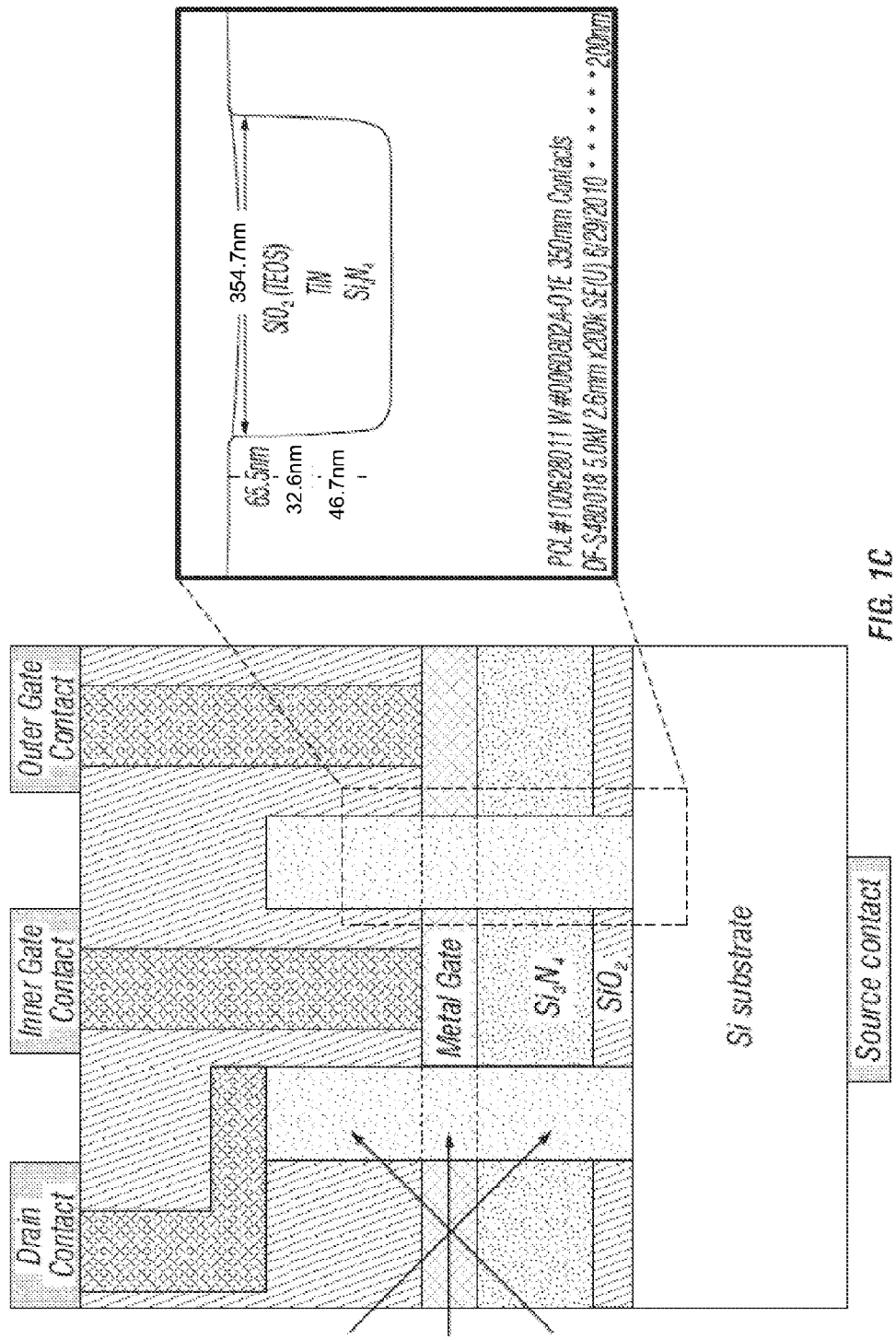
FIG. 1C is a microscopic cross-section of the cylindrical-shaped nanotube FET hosting trench according to one embodiment of the disclosure.

An n++ doped region 120a may serve as the source region for the transistor 100. An outer gate 104 and inner gate 102 may include a metal/high-k dielectric stack. According to one embodiment, the metal is a mid-band gap material. A portion of the gate stack is illustrated in the scanning electron microscopy cross-section of FIG. 1C. FIG. 1C illustrates the stack after etching the cylindrical ring 120. The stack may include low-k dielectric/metal (gate)/low-k dielectric/substrate. According to one embodiment, when the substrate 100 is silicon, un-doped epitaxial silicon may be grown from the etched openings to form the source region 120a. The region 120b of the ring 120 forms the channel/body of the transistor 100. The region 120c of the epitaxial silicon just above the gate stack may be n++ doped to form a drain region of the transistor 100.

According to one embodiment, the transistor 100 may be designed having a channel length ($L_g$) of 30 nm and an epi-silicon body/ring width ($W_{Si}$) of 20 nm. The inner gate 102 and the outer gate 104 may include a metal/HfO$_2$/interfacial SiO$_2$ stack with an effective oxide thickness (EOT) of 0.5 nm. The source and the drain regions may be doped with arsenic (As) with a constant doping level of $10^{20}$ cm$^{-3}$.

FIGS. 2A-2C illustrate one embodiment of a cylindrical-shaped nanotube field effect transistor (FET) architecture 200. In one embodiment, the cylindrical-shaped nanotube FET 200 may include one or more core-shell gate stacks. The core-shell gate stacks may provide the cylindrical-shaped nanotube FET advantages such as enhanced high performance operation and/or area scaling benefits.

FIG. 2A shows a 3D cross section cut through the middle (from top view) of the cylindrical-shaped nanotube FET. FIG. 2B shows a transmission electron microscopy (TEM) image of a cross-sectional view of the cylindrical-shaped nanotube FET. FIG. 2C shows a top view when the cylindrical-shaped nanotube FET cut through the channel area. In the depicted embodiment, the cylindrical-shaped nanotube FET 200 includes core-shell gate stacks which includes an outer (shell) gate 202 and an inner (core) gate 204. With a shell gate 202 and core gate 304, the nanotube FET 200 forms a hollowed cylindrical shaped nanotube structure.

High drive current and low short channel effect (SCE) in cylindrical-shaped nanotube FETs may be accounted for by ballistic transport theory in combination with the structure of the cylindrical-shaped nanotube FET. The cylindrical-shaped nanotube FET may be an ultra short channel device having a saturated drain current ($I_{d,sat}$) according to ballistic theory as:

$$I_{d,sat} \approx C_{inv}(V_{gs}-V_t)Wv_t$$

Thus, the drive current may depends on the inversion charge density [$Q_i = C_{inv}(V_{gs}-V_t)$] and the thermal injection velocity, $v_t$. According to one embodiment, biasing the cylindrical-shaped nanotube FET may cause the two inversion layers to merge resulting in an increased carrier concentration in the channel. According to another embodiment, the cylindrical-shaped nanotube FET may have an abrupt doping profile in the source and drain regions formed by in-situ doping during the epitaxial growth process. The abrupt profiles translate to an increased number of carriers at the point of the highest barrier near the source. Under sufficient drain and gate bias, these carriers may be injected (from the source side) with an increased velocity. According to one embodiment, the velocity may approach the ballistic limit.

Alternatively, the output drive current equation for the cylindrical-shaped nanotube FETs can be approximated by:

$$I_{d,sat} \approx \beta C_{inv}(V_{gs} - V_t)Wv_t + (1 - \beta)\mu_n C_{ox}\frac{W}{2L}(V_{gs} - V_t)^2,$$

$$(0 < \beta < 1)$$

Here, $\beta$ is the coefficient of ballisticity. Generally, a high $\beta$ value is preferable for an ultra short channel device.

In a conventional NMOS long channel device the carrier mobility may be a result of interface and Coulumbic scattering events between source and drain regions of the NMOS. In the cylindrical-shaped nanotube FET disclosed in the embodiments above, volume inversion may result in reduced scattering in un-doped regions. Thus, in the cylindrical-shaped nanotube FET carrier mobility may have little to no effect on drive current ("ballistic transport").

According to one embodiment, an un-doped channel in the cylindrical-shaped nanotube FET may reduce or eliminate random dopant fluctuations (RDF). Conventional short channel NMOS devices obtain a desired threshold voltage ($V_t$) through doping of the transistor channel. However, dopant levels are process dependent, and dopant positions and distribution in the channel may vary between devices in conventional NMOS. Consequently, $V_t$ variations exist in conventional NMOS devices, which may translate to either negative or positive shifts affecting $I_{on}/I_{off}$ and the sub-threshold slope (SS). Cylindrical-shaped nanotube FETs may not include dopants in the channel region, thus, cylindrical-shaped nanotube FETs may be manufactured in a less costly process with higher yield.

Figure 3:
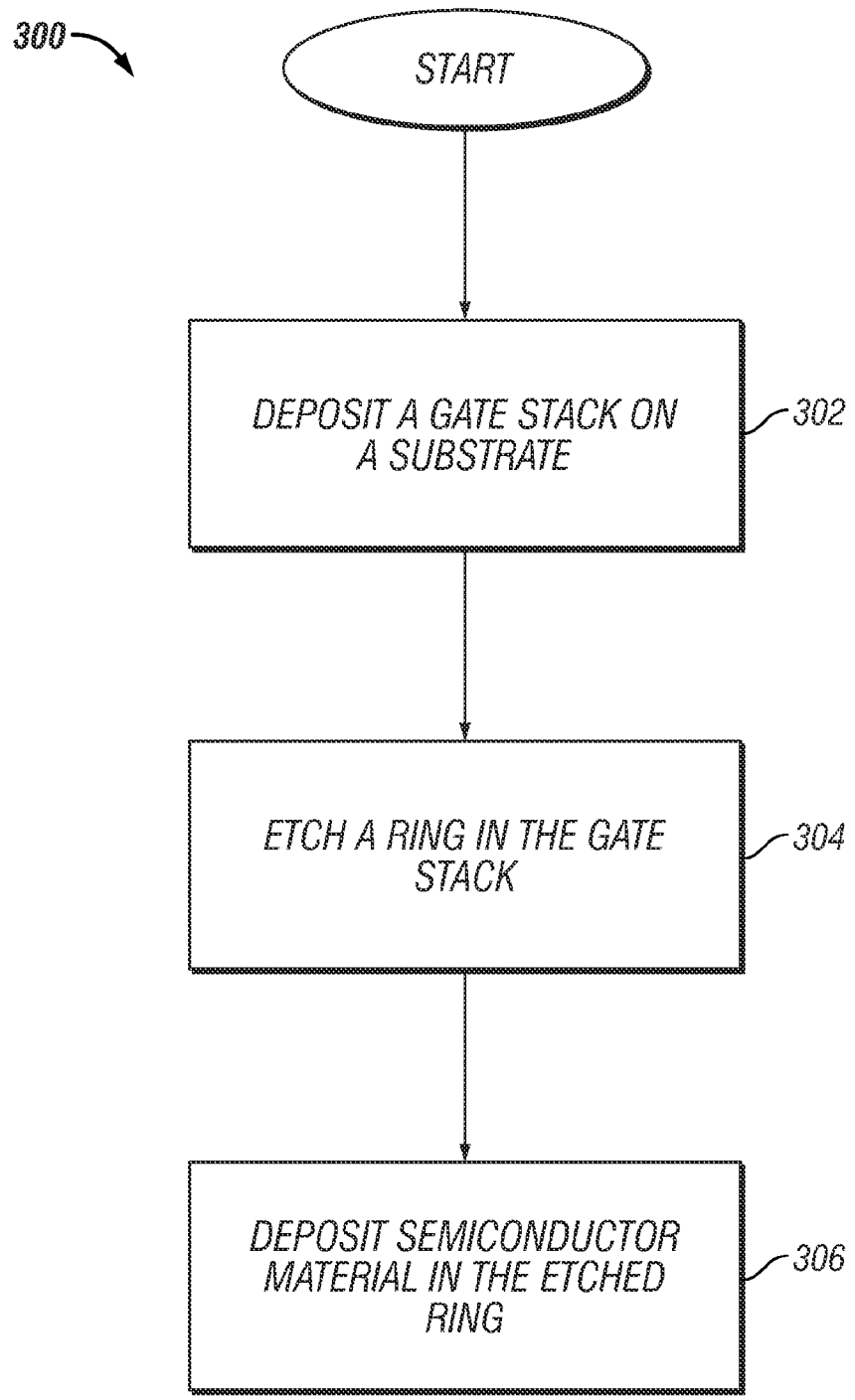
FIG. 3 is a flowchart illustrating a method of manufacturing a cylindrical-shaped nanotube FET according to one embodiment of the disclosure.

FIG. 3 is a flowchart illustrating a method of manufacturing a cylindrical-shaped nanotube FET according to one embodiment of the disclosure. A method 300 begins at block 302 with depositing a gate stack on a substrate. For example, a stack of silicon nitride and titanium nitride may be deposited on a silicon substrate having a layer of silicon dioxide on the surface of the substrate. At block 304 a ring is etched in the gate stack. According to one embodiment, the etching may continue through an oxide layer of the substrate. The etching may be performed through physical etching such as sputtering or reactive etching such as reactive ion etching or wet etching. The ring may have a width of approximately 1 to 15 nanometers. At block 306 a semiconductor material is deposited in the etched ring. According to one embodiment, the deposition is an epitaxial deposition of silicon on the silicon substrate. The semiconductor material may be deposited through other methods such as atomic layer deposition (ALD), chemical vapor deposition (CVD), and/or electrodeposition.

The cylindrical-shaped nanotube FET described in the embodiments above includes a tube/ring shaped device architecture with inner and outer gates. Although only two gates are illustrated, additional gates may be included. Volume inversion may occur in cylindrical-shaped nanotube FETs with ring widths up to 50 nm channel thickness. Because cylindrical-shaped nanotube FETs may be manufactured at larger sizes than conventional transistor structures and obtain similar or better performance, cylindrical-shaped nanotube FETs may be manufactured with cheaper manufacturing processes with lower aspect ratios. The cylindrical-shaped nanotube FET demonstrates better SCE mitigation and higher performance ($I_{on}/I_{off}$) than conventional transistor devices. The $L_g$ may be controlled with process integration flexibility to achieve uniform doping profiles with in-situ doping during epitaxial channel formation of different orientations. Additionally, the construction of cylindrical-shaped nanotube FETs on Si substrates lowers the cost of materials compared to conventional devices built on SOI.

EXAMPLE

The viability of p-type cylindrical-shaped nanotube FET with silicon as the channel material is analyzed. The cylindrical-shaped nanotube architecture was simulated using a combination of classical drift-diffusion transport models in conjunction with quantization models to account for confinement/quantization effects arising in ultra short channel devices. The simulated device consists of heavily doped (constant Boron doping of $10^{20}$ cm$^{-3}$) silicon source and drains with a thin intrinsic hollow cylindrical body which serves as the silicon nanotube channel. This Si <100> oriented nanotube is sandwiched between an inner core gate and outer shell gate. The two vertical gate stacks consist of a mid-band gap metal gate and nitride dielectric layer. An EOT of 0.5 nm is utilized for the simulations.

In order to simulate the ultra short channel cylindrical-shaped silicon nanotube FET, a semi-classical transport model is used where quantum confinement effects are taken into consideration. The transfer characteristics ($I_d$-$V_g$) of a 20 nm gate (channel) length ($L_g$), 10 nm thick (channel thickness) p-type silicon cylindrical-shaped nanotube FET alongside its n-type counterpart shows that silicon p-type nanotube FET has a non-normalized output drive current of 0.4 mA, while the output drive from the n-type is almost 0.7 mA.

Figure 4:
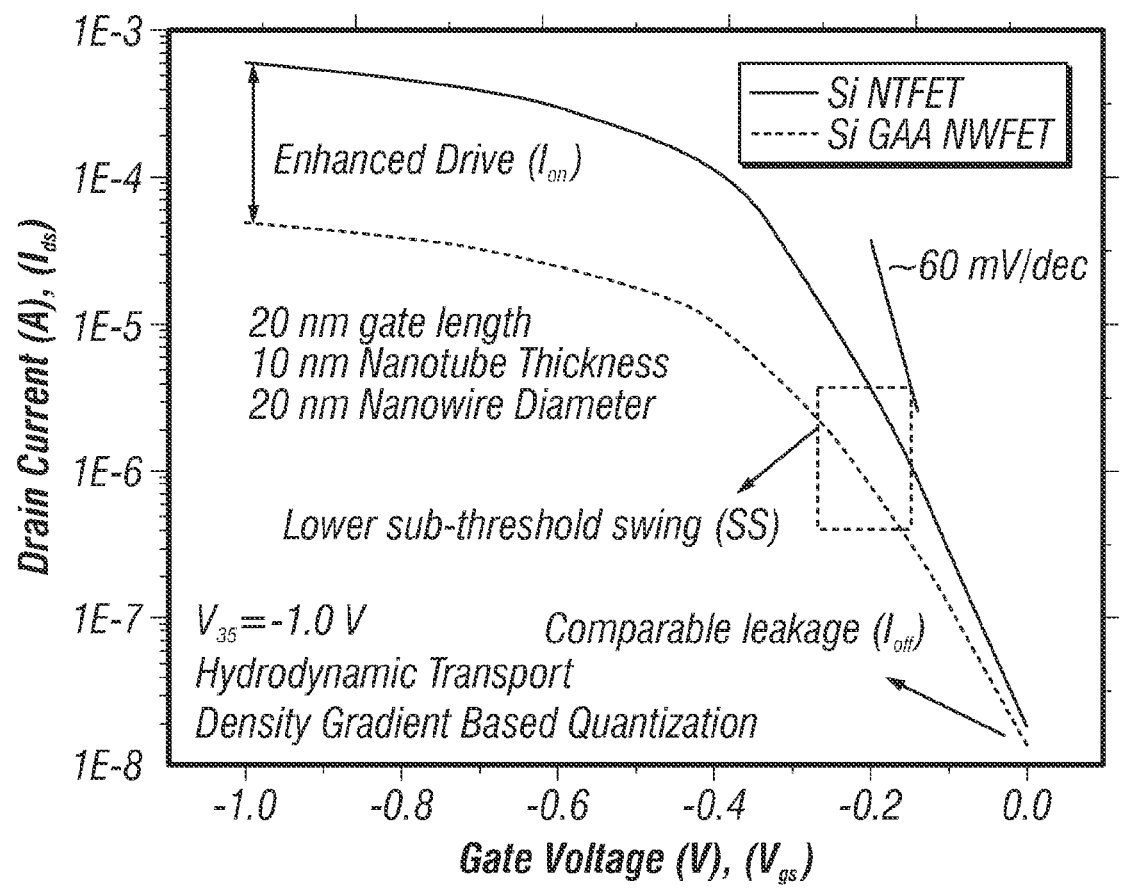
FIG. 4 shows non-normalized performance of a cylindrical-shaped nanotube FET, according to one embodiment of the disclosure.
Figure 6A:
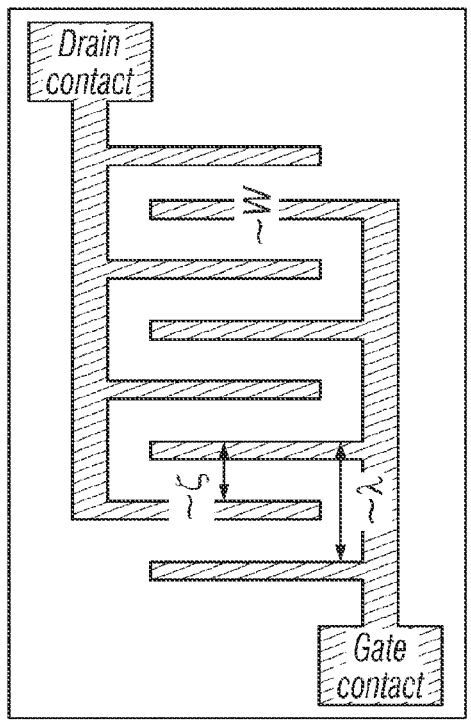
FIGS. 6A-6D compare the layout of a cylindrical-shaped nanotube FET with various types of FETs, according to one embodiment of the disclosure.
Figure 6B:
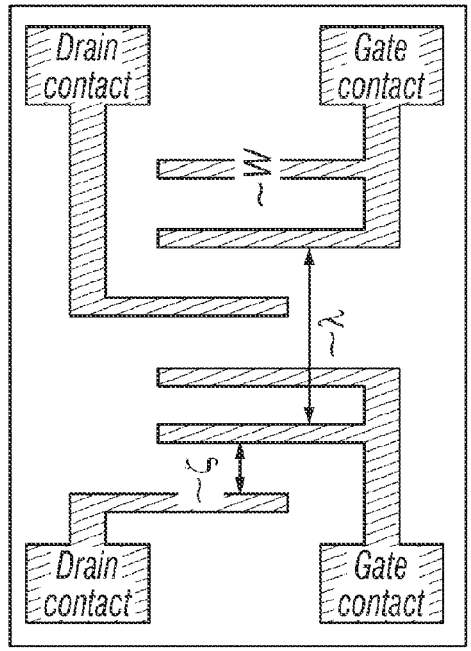
Figure 6C:
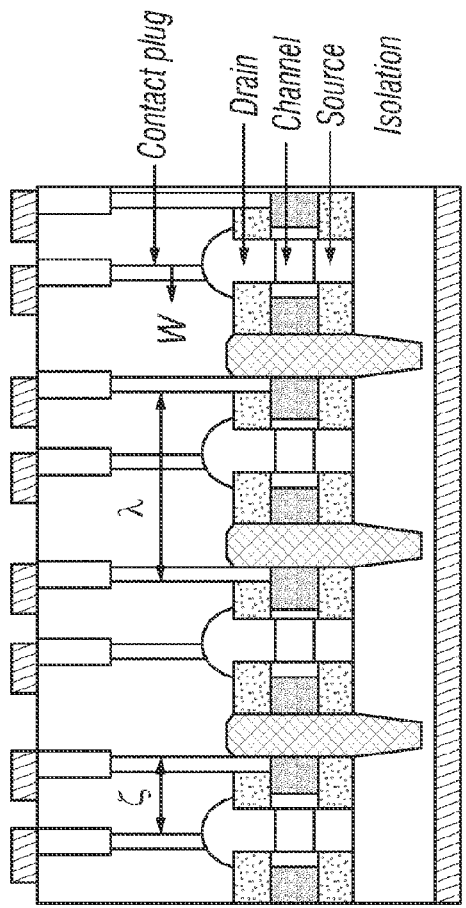
Figure 6D:
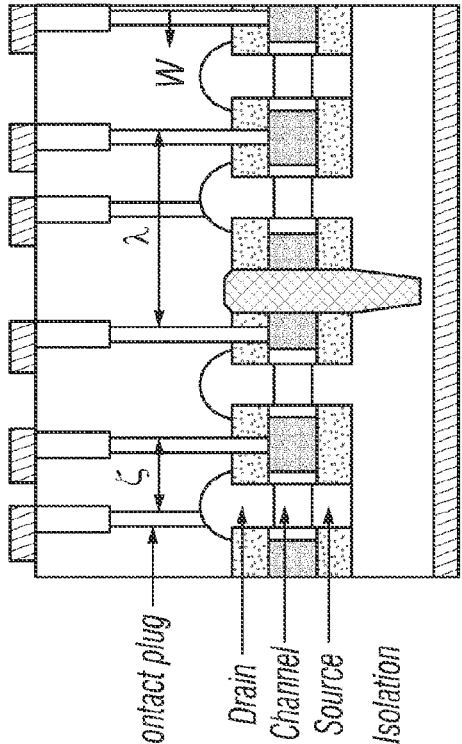

FIG. 4 compares the performance of cylindrical-shaped silicon nanotube FETs (Si NTFET) with silicon (Si GAA NWFET). The $I_d$-$V_g$ curve in FIG. 4 indicates that a single 10 nm thick cylindrical-shaped nanotube FET is capable of 10× drive current improvement compared to a single GAA nanowire while maintaining a higher sub-threshold swing and a comparable off state leakage current.

The non-normalized output drive current ($I_{SiNT}$) of a single 20 nm gate length and 10 nm thick pMOS nanotube FET (p-Si source/intrinsic Si channel/p-Si drain) is nearly 0.611 mA. The cylindrical-shaped nanotube FET has an inner core gate diameter of 100 nm. To compare it to a similar GAA NWFET, it is desirable to consider a nanowire with a diameter of 20 nm, from which a total non-normalized output drive of 50 µA (simulated) is achievable. Quantitatively, this means that the output drive from single p-type cylindrical-shaped silicon nanotube FET is equal to that of 13× GAA NWFETs. An additive analysis shows:

Non-normalized off-state leakage from a single p-GAA NWFET~14.3 nA.

Non-normalized off-state leakage from a single p-nanotube FET~18.5 nA

In an array of GAA NWFETs, since both $I_{on}$ and $I_{off}$ are additive, the total non-normalized off-state leakage current from 13 p-type GAA NWFET will be 186 nA (13×14.3 nA).

So theoretically, the cylindrical-shaped silicon nanotube FET is capable of providing an output drive equal to 13 p-type GAA NWFETs and at the same time having a leakage current comparable to that of a single GAA NWFET.

FIG. 5 compares cylindrical-shaped nanotube FETs with array of vertically stacked GAA NWFETs from a chip-area perspective. The parameter ζ (5 nm), λ (70-80 nm) and W (20 nm) are the minimum contact-gate pitch, minimum device-device pitch and minimum contact width respectively for a pMOS device at the 15 nm technology node. So theoretically, 13 nanowires need to be stacked in the gate-all-around fashion to achieve a drive current of a single cylindrical-shaped silicon nanotube FET (having an inner core gate diameter of 100 nm). To compare one silicon NTFET with 13× GAA NWFETs, consider that both devices have a back-gated source contact. For relaxed processing constraints, a contact width (W) of 300 nm is considered. The total contact area per unit length consumed by 13 nanowires based on the 15 nm technology node parameters gives:

$$A_{NW\_norm}=13\times(\lambda+\zeta+2\times W)\sim 8.775\ \mu m$$

The equivalent normalized contact area consumed by a silicon nanotube transistor can be calculated as:

$$A_{NT\_norm}=1\times(\lambda+\zeta+3\times W)\sim 0.975\ \mu m$$

Taking the ratio of the two normalized contact areas gives a value of approximately 11% (0.975 μm/8.775 μm). To sum up, a single 20 nm gate length, 10 nm thick p-FET silicon nanotube transistor is capable of providing the output drive current of approximately 13 nanowires (20 nm diameter) in a gate-all-around configuration while maintaining an off-state leakage current similar to that of a single 20 nm diameter NWFET. At the same time the cylindrical-shaped nanotube FET occupies a contact area equivalent to just around 11% of that occupied by the 13 GAA NWFETs.

To compare the cylindrical-shaped nanotube FET with a lateral array of GAA NWFETs, it is desired to consider the effective area footprint occupied by the 13 nanowires and a single nanotube. In the case of laterally stacked GAA NWFETs, as shown in FIG. 6, if assuming a nanowire pitch (λ) of 4 nm and nanowire physical length ($L_{phys}$) of 800 nm and diameters ($D_{NW}$) of 20 nm, simple math indicates that the total area occupied by 13 nanowires in the lateral array is approximately;

$$A_{NW}=L_{phys}\times[(13-1)\times\lambda+13\times D_{NW}]=0.25\ \mu m^2$$

For the case of a single nanotube;

$$A_{NT\_norm}=\pi\times r_2^2=0.038\ \mu m^2$$

The total non-normalized area occupied by the nanotube is about 0.038 μm² with the dimensions given in FIG. 6. Taking the ratios of the areas indicates that a single nanotube occupies an area of 15% compared to 13 (800 nm long) laterally stacked GAA nanowires.

FIG. 6A-6D are cross-sectional views that compare effective areas of cylindrical-shaped nanotube FETs and gate-all-around nanowire FETs (GAA NWFET) according to one embodiment of the disclosure. A single cylindrical-shaped nanotube FET can have a nanotube thickness of 10 nm with an inner core gate diameter of 100 nm from area scaling perspective. The effective area through which the output current flows (due to volume inversion) is approximately 3455.749 nm. In contrast, a gate-all-around NWFET of 10 nm thickness has an effective area of 78.54 nm. This comparison suggests that a single cylindrical-shaped nanotube FET can be equivalent to 44 nanowires.

The non-normalized output drive currents from the cylindrical-shaped nanotube FET and the gate-all-around NWFET with the above dimensions are approximately 0.9653 mA and 17.07 μA, respectively. The current ratios indicate that a single cylindrical-shaped nanotube FET is equivalent to stacking 56 silicon gate-all-around NWFETs together. Furthermore, unlike most NWFETs where a metal (preferably noble metal) catalyst seed of gold or platinum is required, the cylindrical-shaped nanotube FETs can be grown via selective epitaxy directly on the silicon substrate. This avoids electrical shorts and charge trapping common in most bottom-up NWFETs due to contamination by residual seed particles.

All of the methods and apparatuses disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

The invention claimed is:

1. An apparatus, comprising:
   a substrate;
   a core gate stack on the substrate;
   a shell gate stack on the substrate, the shell gate stack being disposed around the core gate stack;
   a ring of semiconductor material disposed between the core gate stack and the shell gate stack, the ring comprising a source region, a drain region, and a channel region,
   a first ring of insulating material disposed between the ring of semiconductor material and the core gate stack;
   a second ring of insulating material disposed between the ring of semiconductor material and the shell gate stack,
   in which each of the core gate stack and the shell gate stack comprise the same layers comprising a stacked first insulating layer, a conducting layer, and a second insulating layer, in which the conducting layer is positioned between the first insulating layer and the second insulating layer and at least partially surrounds the channel region.

2. The apparatus of claim 1, in which the substrate comprises a semiconductor material.

3. The apparatus of claim 2, in which the substrate comprises silicon.

4. The apparatus of claim 3, in which the ring comprises materials in groups II and IV of the periodic table.

5. The apparatus of claim 3, in which the ring comprises materials in groups III and V of the periodic table.

6. The apparatus of claim 1, in which the ring has a width of 1 to 15 nanometers.

7. The apparatus of claim 1, in which the drain region and the source region are n-type.

8. The apparatus of claim 1, in which the drain region and the source region are p-type.

9. The apparatus of claim 7, in which the drain region and the source region are doped with dopant with a doping level of $5\times 10^{19}$ to $5\times 10^{20}$ cm$^{-3}$.

10. The apparatus of claim 1, further comprising:
a source contact coupled to the substrate;
a drain contact coupled to the drain region;
an inner gate contact extending through the second insulating layer to contact a portion of the conducting layer within the ring of semiconductor material; and
an outer gate contact extending through the second insulating layer to contact a portion of the conducting layer outside the ring of semiconductor material.

11. The apparatus of claim 1, in which the apparatus is incorporated into a microprocessor.

12. The apparatus of claim 1, in which substantially all of the source region and substantially all of the drain region are contained between the core gate stack and the shell gate stack.

13. The apparatus of claim 1, in which the channel region is undoped.

14. The apparatus of claim 1, in which a doping profile in at least one of the source region and the drain region comprise an abrupt doping profile.

15. The apparatus of claim 1, in which the source region is in contact with the substrate, and in which the apparatus further comprises a source contact in contact with the substrate.

16. The apparatus of claim 15, in which the source region is in contact with a first side of the substrate, and in which the source contact is in contact with a second side opposite the first side of the substrate.

17. The apparatus of claim 1, in which each of the channel region, at least a portion of the source region, and at least a portion of the drain region are contained between the core gate stack and the shell gate stack.

\* \* \* \* \*